United States Patent [19]
Ishida et al.

[11] Patent Number: 4,881,026
[45] Date of Patent: Nov. 14, 1989

[54] METHOD AND APPARATUS FOR DIAGNOSING ABNORMAL STATE OF SODIUM (NA)—SULFUR (S) CELL

[75] Inventors: Yasumasa Ishida; Hiroyuki Kawamoto, both of Hitachi; Motoi Wada, Kyoto; Hisamitu Hatoh; Yoshiteru Miyatake, both of Hitachi; Sadao Mori, Chiba; Eiji Takahashi, Tokyo, all of Japan

[73] Assignees: Hitachi, Ltd.; The Tokyo Electric Power Co., Ltd., both of Tokyo, Japan

[21] Appl. No.: 66,208

[22] Filed: Jun. 25, 1987

[30] Foreign Application Priority Data

Jun. 25, 1986 [JP] Japan .................. 61-147069

[51] Int. Cl.$^4$ .................................... G01N 27/00
[52] U.S. Cl. .................. 324/71.1; 204/401; 204/421; 324/434; 324/522; 324/537; 429/91
[58] Field of Search ........... 324/522, 527, 537, 551, 324/434, 430, 71.1, 525, 425; 204/401, 421; 429/91, 104

[56] References Cited

U.S. PATENT DOCUMENTS

| | | | |
|---|---|---|---|
| 3,519,842 | 7/1970 | Furuishi | 307/297 |
| 3,661,748 | 5/1972 | Blackmer | 204/401 |
| 4,368,423 | 1/1983 | Liburdy | 324/71.1 X |
| 4,578,325 | 3/1986 | Gotou et al. | 429/91 |
| 4,590,430 | 5/1986 | Vandenberghe et al. | 324/427 |

FOREIGN PATENT DOCUMENTS

| | | |
|---|---|---|
| 0013005 | 7/1980 | European Pat. Off. . |
| 0112242 | 6/1984 | European Pat. Off. . |
| 2137038 | 12/1972 | France . |
| 97273 | 6/1983 | Japan . |
| 58-153183 | 9/1983 | Japan .................. 324/551 |
| 1390663 | 4/1975 | United Kingdom . |

OTHER PUBLICATIONS

Journal of Power Sources, vol. 17, Nos. 1-3, Jan.-Apr. 1981, pp. 228-235: M. Wada et al.: "In-test and post-text analyses of sodium-sulfur cells" p. 203; p. 232 paragraph 4, Cell voltage fluctuation.

Primary Examiner—Reinhard J. Eisenzopf
Assistant Examiner—Robert W. Mueller
Attorney, Agent, or Firm—Antonelli, Terry & Wands

[57] ABSTRACT

Disclosed is a method and apparatus which can detect progress of degradation of a sodium-sulfur cell and predict possibility of final breakdown of the cell in a very near future before such a final breakdown of the cell actually occurs. The method and apparatus for diagnosing the presence or absence of an abnormal state in the sodium-sulfur cell, containing a porous electrical conductive material impregnated with molten sulfur or sodium polysulfide as its positive electrode reactant and containing sodium as its negative electrode reactant, comprises observing the operating voltage of the cell during charging and discharging so as to detect occurrence of a minute ripple in the operating voltage, and, when the amplitude of the ripple and the frequency of occurrence of the ripple increases as a result of repeated cycles of charging and discharging, deciding that degradation of the cell has progressed to an extent that final breakdown of the cell will occur in a very near future.

7 Claims, 5 Drawing Sheets

FIG. I
PRIOR ART
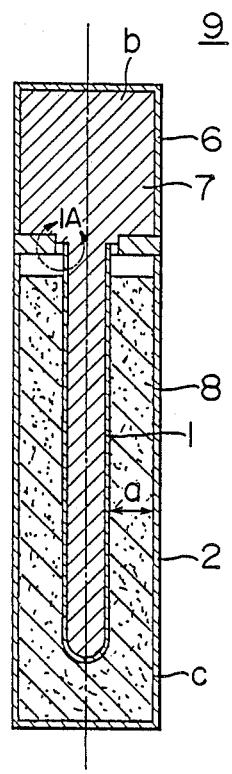
FIG. IA
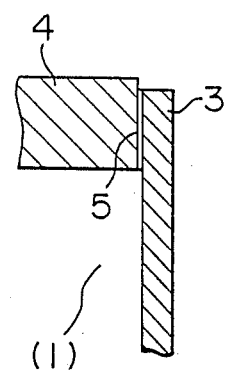

METHOD AND APPARATUS FOR DIAGNOSING ABNORMAL STATE OF SODIUM (NA)—SULFUR (S) CELL

BACKGROUND OF THE INVENTION

1. Field of the Invention

This invention relates to a method and apparatus for diagnosing a sodium-sulfur cell for the presence or absence of any abnormal state, and more particularly to a method and apparatus of the kind described above which can detect progress of degradation of a sodium-sulfur cell and predict possibility of catastrophic breakdown of the cell in a very near future before such a final breakdown of the cell actually occurs.

2. Description of the Prior Art

A sodium-sulfur cell (which will be often abbreviated hereinafter as an Na-S cell) is a secondary cell of a type operating at a high temperature. In the sodium-sulfur cell, molten sodium which is a reactant of a negative electrode is disposed on one side of an electrolyte tube permeable to sodium ions only, while molten sulfur which is a reactant of a positive electrode is disposed on the other side of the electrolyte tube. The sodium-sulfur cell is charged and discharged at a temperature as high as about 300° to 350° C. The following cell reaction occurs when the sodium-sulfur cell is charged and discharged:

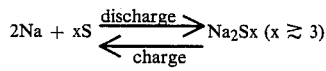

That is, in the discharge mode, sodium turns into sodium ions by freeing electrons, and the sodium ions permeate the electrolyte tube, which is the separator, and react with sulfur to produce sodium polysulfide, $Na_2S_x$, as a discharged product. On the other hand, in the charge mode, a voltage higher than the cell voltage is applied across the cell to cause a reaction reverse to that occurring in the discharge mode.

FIG. 1 shows a practical structure of a prior art sodium-sulfur cell 9.

Referring to FIG. 1, a bladder-like electrolyte tube 1 made of a material such as β-alumina having an Na-ion conductivity is coaxially disposed in a positive electrode container (an outer electrode) 2 in the form of a cylindrical metal member having a closed bottom, in such a relation that a predetermined spacing a is maintained between the electrolyte tube 1 and the positive electrode container 2. The electrolyte tube 1 is joined or fixed at the outer periphery of its upper end opening 3 to a member 4 of an electrical insulator such as α-alumina ring in a cantilever fashion by a jointing member 5 such as glass solder. A negative electrode container 6 in the form of a cylindrical member having a closed top is disposed opposite to and fixed to the positive electrode container 2 through the insulator member 4 to constitute the cell body.

In the space b enclosed by the electrolyte tube 1 and negative electrode container 6, sodium acting as a negative reactant is filled together with porous metal fibers to constitute a negative electrode 7.

On the other hand, in the space c enclosed by the electrolyte tube 1 and positive electrode container 2, porous carbon impregnated with sulfur acting as a positive reactant is filled to constitute a positive electrode 8. The metal fibers filled in the space b to constitute the negative electrode 7 together with the sodium have a function of holding the sodium so as to prevent occurrence of a violent exothermic reaction between the sodium and the sulfur which direct reaction occurs when the electrolyte tube 1 is ruptured. Further, the carbon filled in the space c to constitute the positive electrode 8 acts to give an electron conductivity to the sulfur. That is, a graphite (carbon) mat is impregnated with sulfur.

In order that the cell reaction can easily take place in the Na/S cell constructed in the manner described above, the wall thickness of the partitioning electrolyte tube 1 permeable to sodium ions is advantageously as small as possible.

However, minute cracks tend to occur in the electrolyte tube 1 as the Na/S cell is repeatedly charged and discharged, and the cracks will develop to such an extent that the electrolyte tube 1 is finally ruptured. In such an event, the sodium directly reacts with the sulfur thereby destroying the function of the cell.

Primarily, many sodium-sulfur cells are connected for the purpose of storage of electric power. Accordingly, impossibility of electric power supply or storage due to breakdown of any one of such sodium-sulfur cells greatly adversely affects the social life as a result of, for example, a sudden stoppage of electric power supply.

JP-A-47-28431 (Japanese patent laid-open in 1972) is a newest publication relating to an Na/S cell. However, this known publication does not disclose any especial technique for diagnosing an abnormal state of the Na/S cell. That is, the known publication merely discloses the structure of an Na/S cell in which a conductive composite having a porosity of 50 to 98% and a pore diameter of 10 to 1,000 μ is used to constitute its positive electrode.

SUMMARY OF THE INVENTION

In view of the circumstances described above, it is a main object of the present invention to provide a method of diagnosing the Na/S cell so that an abnormal state attributable to occurrence of minute cracks in an electrolyte tube due to progressive degradation of the cell as a result of repeated cycles of charging and discharging can be predicted and discovered before the cracks penetrate the electrolyte tube resulting finally in destruction of the Na/S cell.

A further object of the present invention is to provide a cell diagnosing method which can simply predict the presence of an abnormal state in any one of Na/S cells constituting each of modules which are minimum controlled units of a power storage system, so that a module including a faulty Na/S cell can be bodily replaced by a sound one.

A further another object of the present invention is to automatically stop the charge-discharge operation of the Na/S cell when the Na/S cell is detected abnormal.

In accordance with the present invention which attains the objects described above, there are provided method and apparatus for diagnosing the presence or absence of an abnormal state in the sodium-sulfur cell containing a porous electrical conductive material impregnated with molten sulfur or sodium polysulfide as its positive electrode and containing sodium as its negative electrode, wherein the operating voltage of the sodium-sulfur cell during charging and discharging is observed to detect occurrence of a ripple in the operating voltage, and, when the amplitude of the ripple and the frequency of occurrence of the ripple increases as a result of cycles of repeated charging and discharging, the Na/S cell is decided that its degradation has progressed to the extent that catastrophic breakdown of the cell will occur in a very near future.

By so observing and deciding, breakdown of the Na/S cell can be predicted before the Na/S cell is finally damaged (for example, at time earlier by several charge-discharge cycles than the time of actual breakdown). Therefore, an appropriate countermeasure of stopping the operation of the damaged Na/S cell and repairing or replacing the cell can be taken before actual breakdown occurs.

BRIEF DESCRIPTION OF THE DRAWINGS

Preferred embodiments of the present invention will now be described in conjunction with the accompanying drawings, in which:

FIG. 1 shows a practical structure of a prior art Na/S cell;

FIG. 1A is a partial view of an enlarged scale of a portion of the cell structure shown in FIG. 1;

DESCRIPTION OF THE PREFERRED EMBODIMENTS

Before describing preferred embodiments of the present invention, the basic principle of the present invention will be briefly described.

The inventors made researches and studies on symptoms exhibited by an Na/S cell with progressive degradation of the cell toward the time of final breakdown, and measured and analyzed all of data which could be externally observed. As a result of the measurement and analysis, the inventors have discovered that, when the Na/S cell is charged and discharged, minute fluctuation is observed in the operating voltage of the cell.

As a result of the analysis of vast data over a long period of time, the inventors have ascertained that the voltage fluctuation described above (that is, a voltage ripple) occurs immediately before the Na/S cell having been progressively degraded is finally damaged.

Since this voltage fluctuation is considered to be related to deterioration and rupture of the electrolyte tube 1, the inventors have measured in detail the phenomena of voltage fluctuation under various operating conditions of the cell and investigated the features of the voltage fluctuation.

Figure 2:
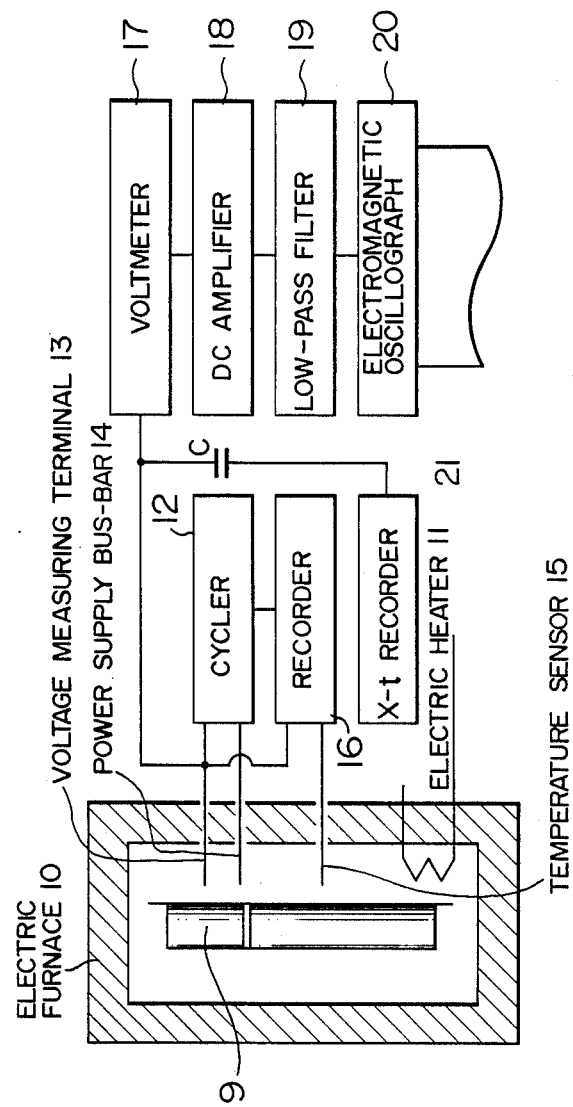
FIG. 2 is a block diagram of a voltage ripple measuring apparatus which is a basic form of the present invention.
Figure 3:
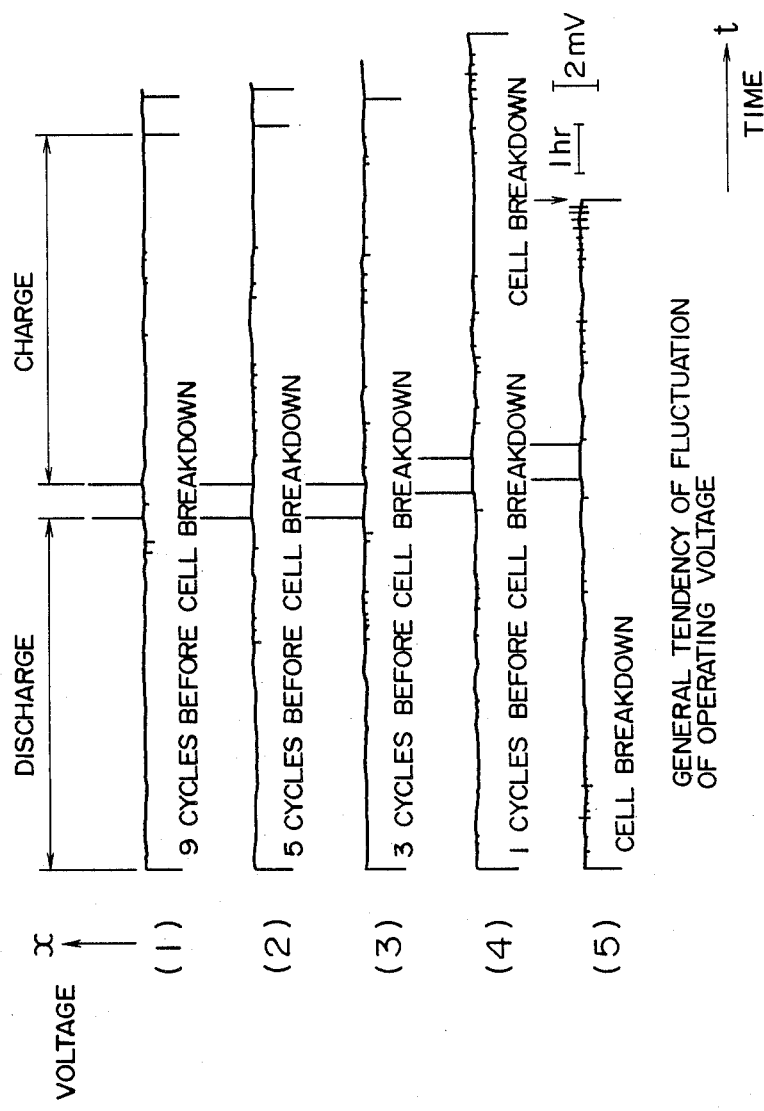
FIG. 3 shows voltage ripples recorded by the x-t recorder in the measuring apparatus shown in FIG. 2.
Figure 4:
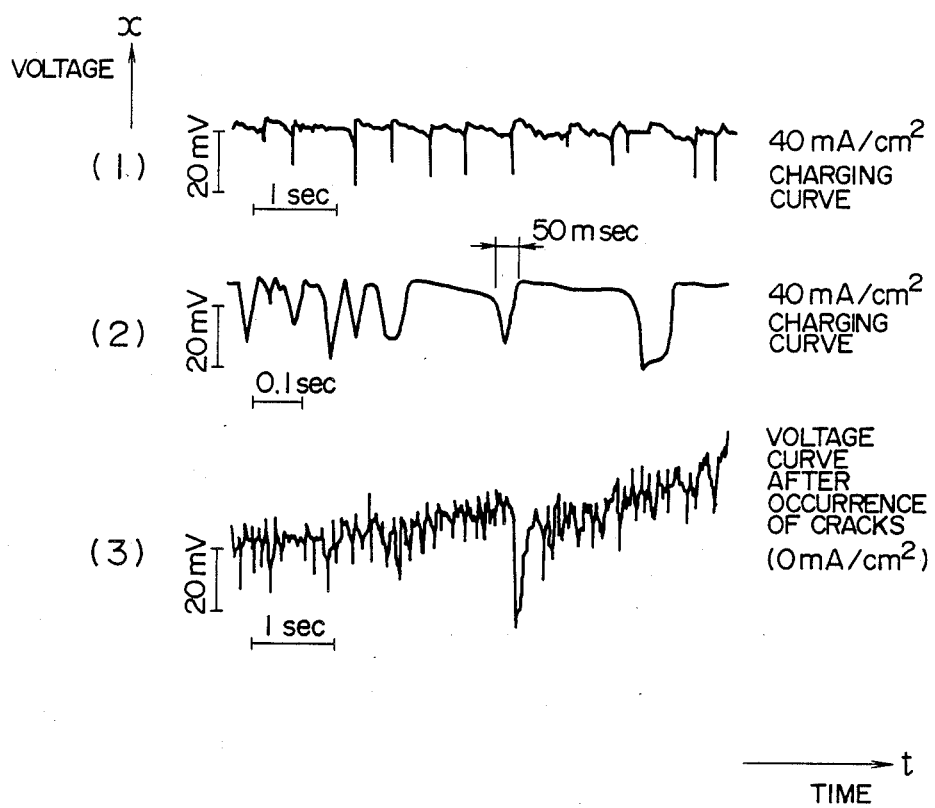
FIG. 4 shows voltage ripple waveforms displayed on an electromagnetic oscillograph.

FIG. 2 is a systematic diagram of a voltage ripple measuring apparatus which is a basic form of the present invention, FIG. 3 shows voltage ripples recorded by the x-t recorder shown in FIG. 2 to illustrate a tendency of occurrence of the voltage ripples, and FIG. 4 shows the voltage ripple waveforms displayed on an electromagnetic oscillograph.

Referring to FIG. 2, an Na/S cell 9 is of a type operable at a high temperature of 300° to 350° C. and is placed in an electric furnace 10 where the cell 9 is heated by an electric heater 11 to be maintained at the operating temperature.

The Na/S cell 9 is charged and discharged at an interval of a predetermined period of time by a charge-discharge apparatus (not shown) automatically repeating charging operation and discharging operation. The voltage, current and temperature of the Na/S cell 9 are detected by a voltage measuring terminal 13 of a cycler 12 (a charging and discharging device), an electric power supply cable 14 and a temperature sensor 15 respectively and recorded by a recorder 16.

Besides this recorder 16, the operating voltage of the Na/S cell 9 is directly read by a voltmeter 17. Further, a d.c. amplifier 18 acts to drift a d.c. component of the operating voltage of the Na/S cell 9 and, at the same time, amplifies a ripple component of the operating voltage of the Na/S cell 9. The output of the d.c. amplifier 18 is applied to a low-pass filter 19 which removes a power-source noise component from the input, and the ripple component only of the operating voltage of the Na/S cell 9 is recorded by an electromagnetic oscillograph 20.

At the same time, the output voltage of the Na/S cell 9 is passed through a capacitor C which acts to remove the d.c. component therefrom, and the output of the capacitor C is applied to an x-t recorder 21 which records a tendency of appearance of voltage ripples during charging and discharging the Na/S cell 9.

FIG. 3 shows voltage fluctuations recorded by the x-t recorder 21, and FIG. 4 shows the fluctuating voltage waveforms recorded by the electromagnetic oscillograph 20.

From FIGS. 3 and 4, the following facts have been found:

(1) A minute fluctuation of the operating voltage starts to be observed from the time earlier by several cycles than the time of final breakdown of the Na/S cell 9. The amplitude of the fluctuations and the frequency of occurrence of the fluctuations increase progressively towards the time of final breakdown of the Na/S cell 9.

(2) The tendency of occurrence of the voltage fluctuations during charging the cell 9 is more marked than that during discharging the cell 9. Further, the voltage fluctuation is almost not observable in the open-circuit condition between the charging operation and the discharging operation immediately before the final breakdown of the cell 9 takes place.

(3) The voltage fluctuation has a pulse waveform, and the pulse width of a typical waveform is about 50 msec.

(4) After the final breakdown of the cell 9, a voltage variation considered to be attributable to cracking of the electrolyte tube 1 occurs even in the open-circuit condition. Further, although not shown, a greater voltage variation occurs at a temperature in the vicinity of the freezing point of the reactant as the temperature goes down after the final breakdown of the cell 9.

Although the mechanism of occurrence of such a voltage variation is not clear at the present time, the inventors consider that this mechanism has some relation with the progress of formation of minute cracks in the electrolyte tube 1.

Thus, by measuring these phenomena, the time of final breakdown of the sodium-sulfur cell can be easily and accurately predicted.

An embodiment of the present invention will now be described with reference to FIG. 5 which shows an electric power storage system using Na/S cells.

Figure 5:
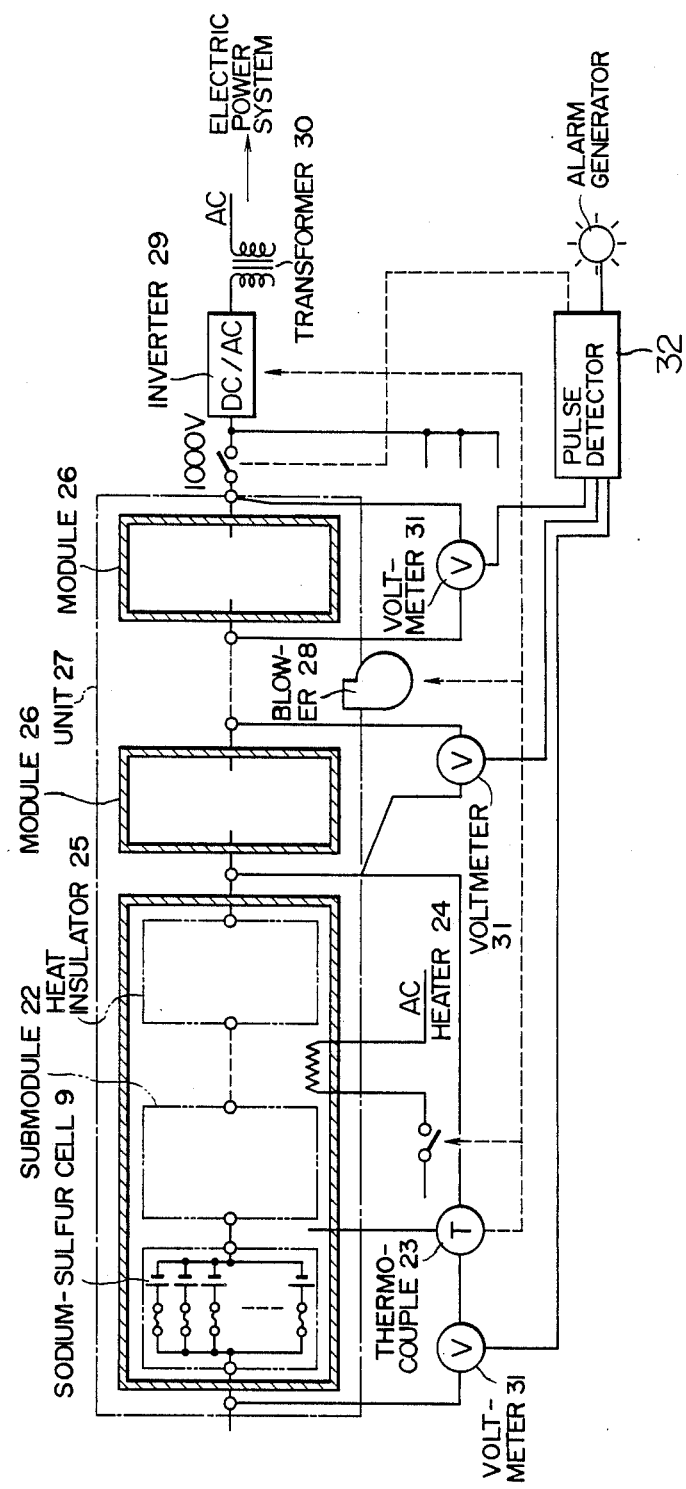
FIG. 5 is a systematic view of an electric power storage system using Na/S cells, to which the present invention is applied.

Referring to FIG. 5, a plurality of Na/S cells 9 are connected in parallel to each other to constitute a submodule 22. A plurality of such submodules 22 are connected in series with each other, and a thermo-couple 23, a heater 24 and a heat insulating member 25 are combined with the submodules 22 to constitute a module 26. A plurality of such modules 26 are connected in series with each other to constitute a unit bank 27 of an electric power storage system.

In order that the temperature measured by the thermo-couple 23 installed in each module 26 can be maintained constant, the heater 24 is on-off controlled, and the rotation speed of a blower 28 is also controlled. According to circumstances, the current of a DC/AC inverter 29 is controlled.

The Na/S cells 9 in the modules 26 constituting the unit bank 27 of the electric power storage system are charged with direct current and discharged with direct current. The d.c. output voltage of the unit 27 is converted by the Dc/Ac inverter 29 into an a.c. voltage, and this a.c. voltage is supplied to an electric power system after being boosted by a transformer 30.

A volt-meter 31 is connected across each of the modules 26 which are smallest units to be controlled, and a minute fluctuation of the operating voltage during charging and discharging the module 26 is observed. By observing such a minute voltage fluctuation, breakdown of any one of the Na/S cells 9 constituting the module 26 and a symptom of the cell breakdown can be easily predicted.

For the purpose of concretely detecting the symptom of the breakdown of any one of the Na/S cells 9 on the basis of the observed minute fluctuation of the cell operating voltage, a ripple component having a level exceeding a predetermined pulse peak value is detected by a pulse detector 32 from the output of the volt-meter 31, and the frequency of appearance of such ripple components or pulses within a predetermined period of time is counted.

When the frequency of appearance of such pulses exceeds a limit, the presence of a damaged Na/S cell 9 is identified by an alarm generator 33 connected to the pulse detector 32, and a switch 34 is opened to stop charging or discharging the Na/S cells 9.

By taking an appropriate measure as described above, the module 26 including the damaged Na/S cell 9 can be repaired or replaced before breakdown of many Na/S cells 9 occurs, so that the reliability of the entire power storage system using the Na/S cells can be improved.

According to the method and apparatus of the present invention described in detail above, breakdown of an Na/S cell which has been degraded due to repeated charging and discharging can be predicted before its final breakdown occurs. Because of the practical effect described above, the present invention contributes greatly to improvements in the reliability of an electric power storage system using Na/S cells.

Further, according to the method and apparatus of the present invention, the presence or absence of a damaged Na/S cell in each of modules which are smallest controlled units of an electric power storage system can be simply predicted, so that the module including the damaged Na/S cell can only be replaced without requiring expensive detecting means.

Furthermore, according to the method and apparatus of the present invention, the operation for charging or discharging the Na/S cells can be automatically stopped when a damaged Na/S cell is detected.

We claim:

1. A method of operating a power storage plant including DC to AC inverter means connected to the output of unit banks of batteries that are connected to receive a DC charge and to discharge through said inverter wherein the method includes:

diagnosing the presence or absence of an abnormal state in advance or breakdown of a cell in a bank including at least three or more modules connected in series which are replaceable as a unit, each module including at least two or more sub-modules connected in series with each sub-module including at least four or more cells connected in parallel and with each cell being a sodium-sulfur (Na/S) cell containing at least one of a porous electrical conductive material impregnated with molten sulfur and a porous electrical conductive material impregnated with sodium polysulfide as its positive electrode reactant and containing sodium as its negative electrode reactant, said method comprising:

observing separately the operating voltage of each of said modules as a smallest component to be monitored during direct current charging and discharging so as to detect occurrence of a minute ripple in the operating voltage which exceeds a predetermined amplitude; and when the amplitude of said ripple and the frequency of occurrence of said ripple increases as a result of repeated cycles of charging and discharging, deciding that degradation of said sodium-sulfur cell has progressed to an extent that final breakdown of said cell will occur in a very near future.

2. A power storage plant including DC to AC inverter means connected to the output of unit banks of batteries that are connected to receive a DC charge and to discharge through said inverter and an apparatus for diagnosing the presence or absence of an abnormal state in advance of cell breakdown in one of said banks of batteries, each bank including as components at least three or more module components connected in series which are replaceable as a unit, each module component including at least two or more sub-module components connected in series with each sub-module component including at least four or more cell components connected in parallel and with each cell being a sodium-sulfur (Na/S) cell containing at least one of a porous electrical conductive material impregnated with molten sulfur and a porous electrical conductive material impregnated with sodium polysulfide as its positive electrode reactant and containing sodium as its negative electrode reactant, said apparatus comprising:

a volt-meter connected across each of said modules as the smallest component to be monitored during direct current charging and discharging of said cells;

a pulse detector connected to said volt-meters connected to said modules respectively; as the smallest number of cells to be monitored as a unit for detecting a voltage ripple having a level exceeding a predetermined pulse peak value from an output of each of said volt-meters;

an alarm generator connected to said pulse detector for generating an alarm when said ripple is detected; and a switch connected to said pulse detector and adapted to be opened to stop charging and discharging of said sodium-sulfur cells based on when said ripple is detected.

3. An apparatus according to claim 2, wherein said switch is automatically opened to stop charging and discharging said sodium-sulfur cells.

4. A method for diagnosing the presence or absence of an abnormal state in advance of cell breakdown in a power station having unit banks of batteries connected in parallel, each bank including at least three or more modules connected in series, each module including at least two or more sub-modules connected in series which are replaceable as a unit, each submodule including at least four or more cells connected in parallel with each cell being a sodium-sulfur (Na/S) cell containing at least one of a porous electrical conductive material impregnated with molten sulfur and a porous electrical conductive material impregnated with sodium polysulfide as its positive electrode reactant and containing sodium as its negative electrode reactant, said method comprising:

observing separately the operating voltage of said modules during direct current charging and discharging so as to detect occurrence of a minute ripple in the operating voltage which exceeds a predetermined amplitude;

continuing detection of said voltage ripple during repeated cycles of charging and discharging; and deciding that degradation of said sodium-sulfur cell has progressed to an extent that final breakdown of said cell will occur in a very near future based on the frequency of occurrence of ripple amplitudes which exceed said predetermined amplitude.

5. Apparatus for diagnosing the presence or absence of an abnormal state in advance of cell breakdown in a power station having:

unit banks of batteries connected in parallel;

each bank including three or more modules connected in series;

each module including at least two or more sub-modules connected in series and replaceable as a unit;

each sub-module including at least four or more cells connected in parallel with each cell being a sodium-sulfur (Na/S) cell containing at least one of a porous electrical conductive material impregnated with molten sulfur and a porous electrical conductive material impregnated with sodium polysulfide as its positive electrode reactant and containing sodium as its negative electrode reactant, said apparatus comprising:

a plurality of modules, each said module being constituted by connecting a plurality of sub-modules in series with each other, each said sub-module being constituted by connecting a plurality of said sodium-sulfur cells in parallel with each other;

a direct current voltage measuring means connected across each of said modules during direct current charging and discharging of said cells; and a pulse detector having a plurality of inputs and outputs, each of said inputs being connected to one of voltage measuring means for detecting a voltage ripple which occurs during said direct current charging and discharging of said cells;

and means responsive to a voltage ripple which exceeds a predetermined peak value connected to the detector output thereby to provide a manifestation that final breakdown of the cell will occur in a very near future.

6. An apparatus according to claim 5, further comprising an alarm generator connected to said monitoring device for generating an alarm in response to an indication that the ripple has exceeded said predetermined peak value.

7. An apparatus according to claim 5, further comprising a normally closed switch connected in a circuit for charging and discharging said cells, means connecting said switch to be operated by an output from said monitoring device and opened to stop charging and discharging of said sodium-sulfur cells based on the frequency of occurrence of indications indicating voltage ripples which exceed said predetermined pulse peak value.

* * * * *